United States Patent [19]
Arase

[11] Patent Number: 5,754,466
[45] Date of Patent: May 19, 1998

[54] FERROELECTRIC MEMORY HAVING PAIR OF REFERENCE CELLS

[75] Inventor: Kenshiro Arase, Kanagawa, Japan

[73] Assignee: Sony Corporation, Japan

[21] Appl. No.: 734,776

[22] Filed: Oct. 22, 1996

[30] Foreign Application Priority Data

Oct. 24, 1995 [JP] Japan .................. 7-275799

[51] Int. Cl.$^6$ .................. G11C 11/22; G11C 11/24
[52] U.S. Cl. .................. 365/145; 365/149
[58] Field of Search .................. 365/145, 149, 365/117

[56] References Cited

U.S. PATENT DOCUMENTS

| | | | |
|---|---|---|---|
| 5,381,364 | 1/1995 | Chern et al. | 365/145 |
| 5,392,234 | 2/1995 | Hirano et al. | 365/145 |
| 5,572,459 | 11/1996 | Wilson et al. | 365/145 |
| 5,574,679 | 11/1996 | Ohtsuki et al. | 365/145 |
| 5,617,349 | 4/1997 | Koike | 365/145 |
| 5,621,680 | 4/1997 | Newman et al. | 365/145 |

OTHER PUBLICATIONS

Tatsumi Sumi et al., "A 256kb Nonvolatile Ferroelectric Memory at 3V and 100ns", 1994 IEEE International Solid-State Circuits Conference, 1994, pp. 268–269.

*Primary Examiner*—David C. Nelms
*Assistant Examiner*—Trong Phan
*Attorney, Agent, or Firm*—Ronald P. Kananen

[57] ABSTRACT

A ferroelectric memory which can ensure a sufficient operational margin at the time of a read operation, includes a transmission transistor and a ferroelectric capacitor which are connected in series between a bit line and a plate electrode. Composite data of a pair of reference cells storing reverse data with each other and data of a read cell are compared before reading out data of a memory cell.

13 Claims, 10 Drawing Sheets

| READ CELL | | MA | MA' |
|---|---|---|---|
| SELECT SIGNAL | S1 | H | H |
| SA | N1 | MA | RM1 (1) RM2 (0) |
| | N2 | RM1' (1) RM2' (0) | MA' |

| READ CELL | | MA | MA' |
|---|---|---|---|
| SELECT SIGNAL | S1 | H | H |
| | S2 | L | H |
| | S3 | H | L |
| SA | N1 | MA | RM1 (1) RM2 (0) |
| | N2 | RM1' (1) RM2' (0) | MA' |
| CAPACITANCE | | CA' | CA |

| READ SELL | | MA | MA' | MB | MB' |
|---|---|---|---|---|---|
| SELECT SIGNAL | S1 | H | H | L | H |
| | S2 | H | H | H | L |
| | S3 | L | H | H | H |
| | S4 | H | L | H | H |
| SA | N1 | MA | RMA(1) RMB(0) | MB | RMA(1) RMB(0) |
| | N2 | RMA'(0) RMB'(1) | MA' | RMA'(0) RMB'(1) | MB' |

FERROELECTRIC MEMORY HAVING PAIR OF REFERENCE CELLS

BACKGROUND OF THE INVENTION

1. Field of the Invention

The present invention relates to a ferroelectric memory with a memory cell constituted by a transistor and a ferroelectric capacitor. More particularly, the present invention relates to a reference cell of such a ferroelectric memory.

2. Description of the Related Art

Known in the art is a ferroelectric memory using an oxide ferroelectric material having a perovskite structure (for example, PbZrTiO$_3$) or a Bi family layer perovskite structure as an insulator film of a capacitor and storing data by utilizing the direction of polarization of the ferroelectric capacitor.

When configuring a memory cell by a select transistor and a ferroelectric capacitor of the above structure, the memory cell is read from using a reference cell constituted by a select transistor and a ferroelectric capacitor the same as the read cell. It is necessary to adjust for example the area of the capacitor or the bias voltage of the reference cell so that it gives a middle state between the data "1" and data "0" of the memory cell when compared against at the time of a read operation.

However, it is difficult to optimize the design so that the reference cell gives a middle state between the data "1" and data "0" of the read cell. The reference cell will also deviate from the middle state resulting in less of a read margin. Further, as the read cell and the reference cell are arranged separated from each other in the layout, variations in the manufacturing process will cause differences in the relative characteristics of the read cell and the reference cell again making it difficult to ensure enough of an operational margin at the time of a read operation.

SUMMARY OF THE INVENTION

An object of the present invention is to provide a ferroelectric memory which can ensure a sufficient operational margin and thus achieve greater reliability.

According to a first aspect of the present invention there is provided a ferroelectric memory, comprising at least one word line, a bit line, a reference word line, a reference bit line, at least one memory cell comprised of a first transmission transistor with a terminal connected to the bit line and a gate connected to the word line and controlled in a conductive state by a level of the word line and a ferroelectric capacitor for storing data with one terminal connected to another terminal of the first transmission transistor and another terminal connected to a plate electrode, a first reference cell comprised of a second transmission transistor with a terminal connected to the reference bit line and a gate connected to the reference word line and controlled in a conductive state by a level of the reference word line and a first reference data storing ferroelectric capacitor for storing first reference data with one terminal connected to another terminal of the second transmission transistor and another terminal connected to a reference plate electrode, and a second reference cell comprised of a third transmission transistor with a terminal connected to the reference bit line and a gate connected to the reference word line and controlled in a conductive state by a level of the reference word line and a second reference data storing ferroelectric capacitor for storing second reference data having a reverse phase from the first reference data with one terminal connected to another terminal of the third transmission transistor and another terminal connected to a reference plate electrode.

Preferably, the memory further comprises a means for reading out at the time of a read operation the data of a read cell to the bit line and the data of the first reference cell and the second reference cell to the reference bit line in parallel, comparing a potential of the read bit line and a potential of the reference bit line, and judging the data of the read cell by the result of the comparison.

Preferably, the ferroelectric capacitors of the first and second reference cells are smaller in size than the ferroelectric capacitor of the read cell.

Alternatively, the ferroelectric capacitor of the read cell may be equal in size to the ferroelectric capacitors of the first and second reference cells.

Preferably, the memory further comprises a means for connecting an additional capacitance to the reference bit line at the time of a read operation.

Preferably, the memory comprises a plurality of memory arrays each constituted by the word line, the bit line, the reference word line, the reference bit line, the memory cell, and first and second cells and the additional capacitance is the capacitance of the bit line of a non-selected memory array.

According to another aspect of the present invention, there is provided a ferroelectric memory, comprising at least one word line, a bit line, a reference word line, a reference bit line, at least one memory cell comprised of a first transmission transistor with a terminal connected to the bit line and a gate connected to the word line and controlled in conductive state by a level of the word line and a ferroelectric capacitor for storing data with one terminal connected to another terminal of the first transmission transistor and another terminal connected to a plate electrode, a first reference cell comprised of a second transmission transistor with a terminal connected to the reference bit line and a gate connected to the reference word line and controlled in a conductive state by a level of the reference word line, a first reference data storing ferroelectric capacitor for storing first reference data with one terminal connected to another terminal of the second transmission transistor and another terminal connected to a reference plate electrode, and a first connecting means for connecting a first connection point of the second transmission transistor and the first reference data storing ferroelectric capacitor to a predetermined first potential; and a second reference cell comprised of a third transmission transistor with a terminal connected to the reference bit line and a gate connected to the reference word line and controlled in a conductive state by a level of the reference word line, a second reference data storing ferroelectric capacitor for storing second reference data having a reverse phase from the first reference data with one terminal connected to another terminal of the third transmission transistor and another terminal connected to a reference plate electrode, and a second connecting means for connecting a second connection point of the third transmission transistor and the second reference data storing ferroelectric capacitor to a predetermined second potential.

Preferably, the memory further comprises a means for writing the first reference data into the first reference cell by connecting the first connection point to the first potential and writing the second reference data into the second reference cell by connecting the second connection point to the second potential.

According to the ferroelectric memory having 1TR-1CP type cells of the present invention, the read operation is performed by comparing the data of the read bit line connected to the read cell with the data of the first and second reference cells storing data having reverse phases with each other and connected to the reference bit line.

As a result, the data of the read cell is compared with data having a middle state between the data "1" and the data "0".

Due to this, it becomes simple to ensure a sufficient read margin.

Also, in the ferroelectric memory, the ferroelectric capacitors for the first and second reference cells may be designed to be smaller in size than the ferroelectric capacitor of the read cell. Ideally, the ferroelectric capacitors for the first and second reference cells are designed to be half the size of the ferroelectric capacitor of the read cell.

Alternatively, in the ferroelectric memory, the ferroelectric capacitor of the first and second reference cell are designed to be the same size as the ferroelectric capacitor of the read cell and an additional capacitance, ideally an additional capacitance having the same capacitance as a usual bit line, is connected to the reference bit line.

As a result, the state of the reference bit line reading out the composite data of the first and second reference cells becomes a middle state of the bit line reading out the data "1" and the bit line reading out the data "0".

More specifically, the additional capacitance is the capacitance of the bit line of a non-selected memory array. Due to this, the additional capacitance becomes the same capacitance of the usual bit line.

Also, in the ferroelectric memory, the first reference cell and the second reference cell have connecting means for connecting the connecting points of a ferroelectric capacitor and select transistor of a 1TR-1CAP type cell similar to a normal memory cell to a predetermined first potential and second potential. Due to this, it is possible to write predetermined data having reverse phases by connecting to predetermined potentials after reading out the data.

As a result, it is possible to recover data even when the data of the first and second reference cells are destroyed at the time of a read operation.

BRIEF DESCRIPTION OF THE DRAWINGS

These and other objects and features of the present invention will become more apparent from the following description of the preferred embodiments made with reference to the drawings, in which.

DESCRIPTION OF THE PREFERRED EMBODIMENTS

Preferred embodiments of the present invention will now be explained in further detail with reference to the drawings.

Figure 1A:
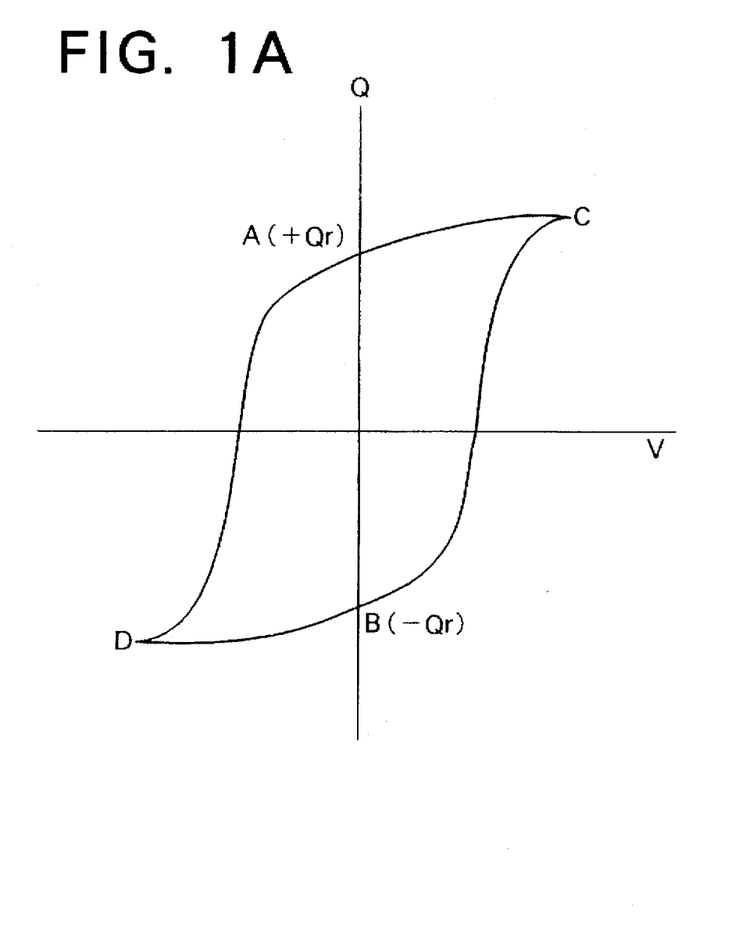
FIG. 1A is a view of the hysteresis of the polarization characteristics of a ferroelectric capacitor.
Figure 1B:
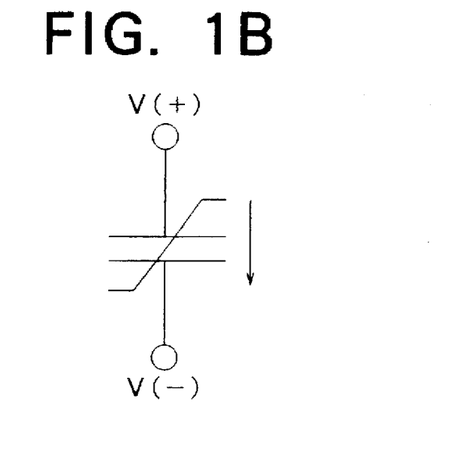
FIGS. 1B and 1C are views of the polarization state of a ferroelectric capacitor written with first data and second data having complementary phases.
Figure 1C:
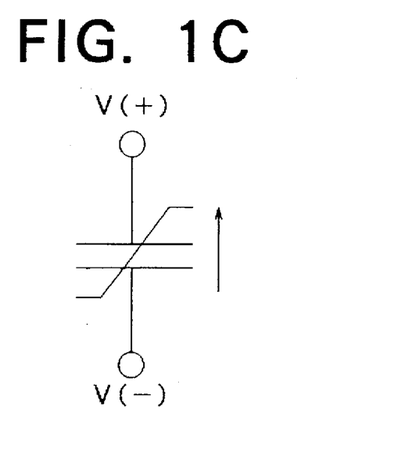

FIG. 1A is a view of the hysteresis of the polarization characteristics of a ferroelectric capacitor, while FIGS. 1B and FIG. 1C are views of the polarization states of a ferroelectric capacitor written with first data (data "1" as mentioned below) and second data (data "0" as mentioned below) having complementary phases with each other.

The ferroelectric memory, in the hysteresis of the polarization characteristics shown in FIG. 1A, supplies a plus side voltage ($\underline{C}$ in FIG. 1A) to a ferroelectric capacitor and adopts the state of a remaining charge of the residual dielectric polarization ($\underline{A}$ in FIG. 1A) represented by +Qr as the data "1" (first data), while supplies a minus side voltage to the ferroelectric capacitor and adopts the state of a remaining charge of the residual dielectric polarization ($\underline{B}$ in FIG. 1B) represented by −Qr as the data "0" (second data). The ferroelectric memory is utilized as a nonvolatile memory.

Figure 2:
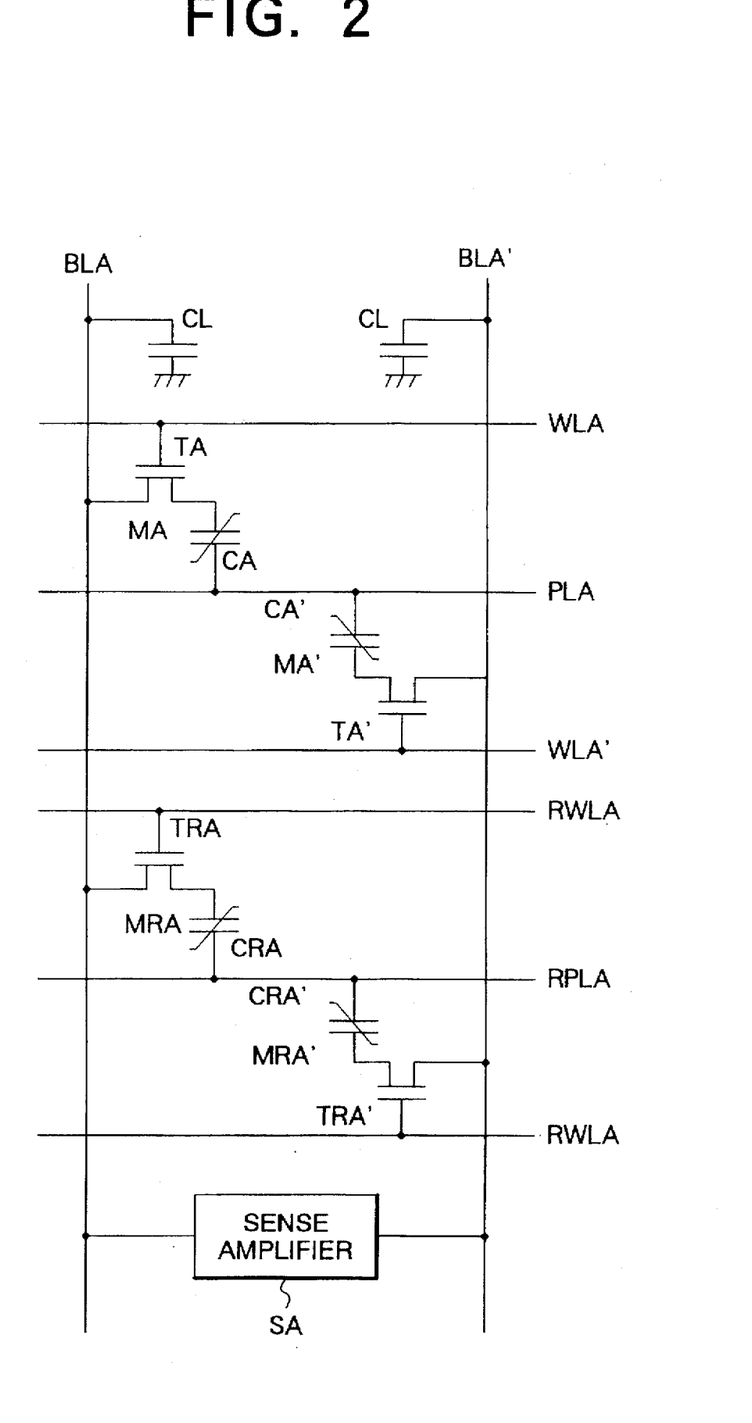
FIG. 2 is a view of a memory array of a one-transistor, one-capacitor (1TR-1CAP) type ferroelectric memory.

FIG. 2 is a view of a memory array of the ferroelectric memory having an 1TR-1CAP type cell.

The memory array of FIG. 2 has a so-called folded bit line structure. In the figure, MA and MA' represent memory cells, MRA and MRA' represent first and second reference cells, WLA and WLA' represent word lines, BLA and BLA' represent bit lines, PLA represents a plate electrode line, RWLA and RWLA' represent word lines for driving the reference cells, RPLA represents a plate electrode line for driving the reference cells, and CL represent a load capacitance of each of the bit lines BLA and BLA'.

The memory cell MA is configured by a select transistor TA and a ferroelectric capacitor CA, while the memory cell MA' is configured by a select transistor TA' and a ferroelectric capacitor CA'.

The reference cells MRA and MRA' are provided for comparing and reading out the data of the memory cells MA and MA'. The reference cell MRA is configured by a select transistor TRA and a ferroelectric capacitor CRA, while the reference cell MRA' is configured by a select transistor TRA' and a ferroelectric capacitor CRA'.

In a ferroelectric memory having the 1TR-1CAP type cell, the operation for reading out the data of the memory cell MA is performed by comparison with the data of the reference cell MRA' connected to the reference bit line BLA' arranged closely to a folded direction of the read bit line BLA. The operation for reading out the data of the memory cell MA' is performed by comparison with the data of the reference cell MRA connected to the reference bit line BLA arranged closely to a folded direction of the read bit line BLA'.

The reference cells MRA and MRA' are optimized in design by adjusting for example the area of the capacitor or bias voltage to give a middle state when the charge of the residual dielectric polarization represented by +Qr or −Qr in the hysteresis characteristic of FIG. 1A is read out.

Accordingly, in the 1TR-1CAP type cell, the potential difference between the read bit line connected to the read cell and the reference bit line connected to the reference cell is amplified by a sense amplifier SA and the data judged.

Figure 3:
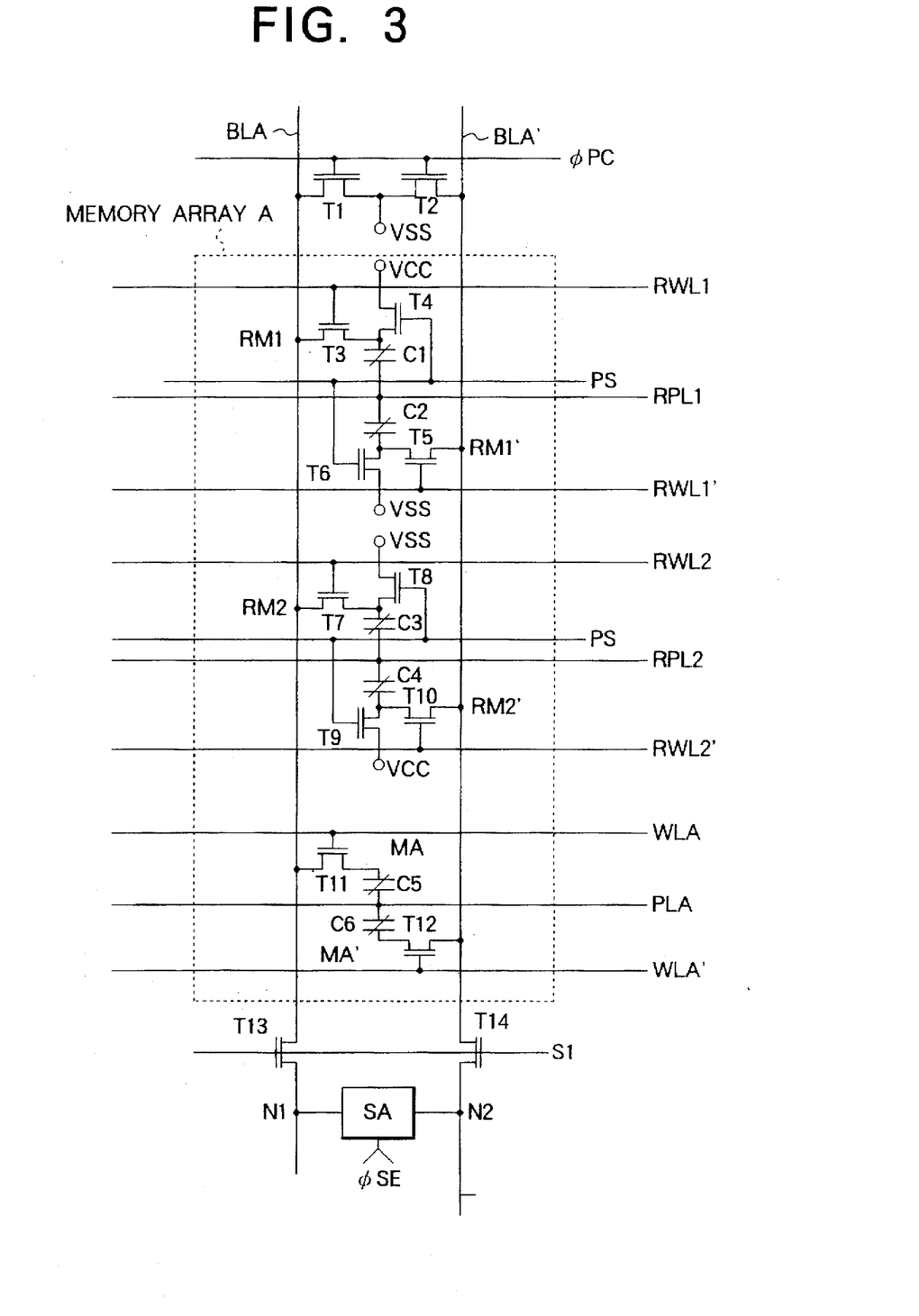
FIG. 3 is a circuit diagram of a first embodiment of a ferroelectric memory according to the present invention.

FIG. 3 is a view of a first embodiment of the ferroelectric memory, more specifically, a ferroelectric memory having a 1TR-1CAP type cell.

The first embodiment shown in FIG. 3 has the ferroelectric capacitors of the first reference cell and the second reference cell are designed to be half the size of the ferroelectric capacitor of the memory cell, so the composite data of the first reference cell and the second reference cell becomes a middle value of the read data "1" and "0".

The memory array of FIG. 3 is configured by a memory array A having a so-called folded bit line structure.

In the memory array A, a memory cell MA is configured by a select transistor T11 and a ferroelectric capacitor C5, while a memory cell MA' is configured by a select transistor T12 and a ferroelectric capacitor C6.

WLA and WLA' represent word lines, BLA and BLA' represent bit lines, and PLA represents a plate electrode line.

Further, reference cells RM1 and RM2 are provided corresponding to the bit line BLA, while reference cells RM1' and RM2' are provided corresponding to the bit line BLA'.

The reference cell RM1 is constituted by a select transistor T3, a ferroelectric capacitor C1, and a preset transistor T4 and connects the ferroelectric capacitor C1 to a supply line of a power source voltage Vcc by a preset signal PS. This presets the reference cell RM1 to the data "1" (first data).

The reference cell RM2 is constituted by a select transistor T7, a ferroelectric capacitor C3, and a preset transistor T8 and connects the ferroelectric capacitor C3 to a supply line of a power source voltage Vss. This presets the reference cell RM2 to the data "0" (second data).

The reference cell RM1' is constituted by a select transistor T5, a ferroelectric capacitor C2, and a preset transistor T6 and connects the ferroelectric capacitor C2 to the supply line of the power source voltage Vss. This presets the reference cell RM1' to the data "0" (second data).

The reference cell RM2' is constituted by a select transistor T10, a ferroelectric capacitor C4, and a preset transistor T9, and connects the ferroelectric capacitor C4 to the supply line of the power source voltage Vcc. This presets the reference cell RM2' to the data "1" (first data).

Also, RWL1, RWL1', RWL2, and RWL2' and RPL1 and RPL2 represent word lines and plate electrode lines for driving each of the reference cells.

Transistors T1 and T2 are provided for precharging the bit lines BLA and BLA' to a ground voltage Vss by a precharge signal φPC.

SA represents a sense amplifier activated by a sense enable signal φSE.

N1 and N2 represent input/output nodes of the sense amplifier SA. Transistors T13 and T14 connect the input/output nodes N1 and N2 to the bit lines BLA and BLA' by a select signal S1.

Figure 4:
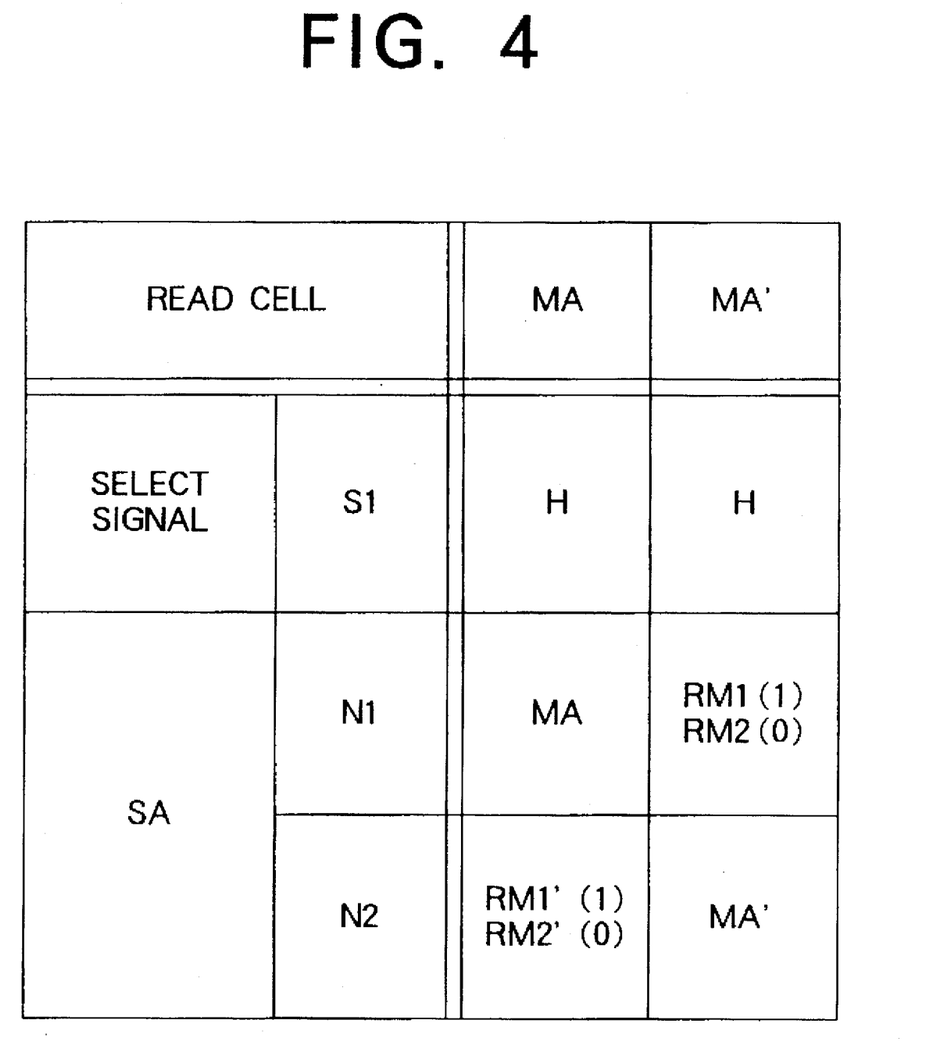
FIG. 4 is a view of a relationship of a connection between input/output nodes of a sense amplifier and a read cell or a reference cell at the time of a read operation in the first embodiment shown in FIG. 3.

FIG. 4 is a view showing which of the read cell or the reference cell connects to the input/output nodes N1 and N2 of the sense amplifier by controlling the select signal S1 when reading out the memory cells MA and MA'.

Namely, when the select signal S1 is set to a high level (H) and reading out the memory cell MA, the memory cell MA is connected to the node N1 and the reference cell RM1' storing the data "0" and the reference cell RM2' storing the data "1" are connected to the node N2.

Also, when reading out the memory cell MA', the reference cell RM1 storing the data "1" and the reference cell RM2 storing the data "0" are connected to the node N1 and the memory cell MA' is connected to the node N2.

Next, an explanation will be made of the operation for writing on and reading from the memory cell in the first embodiment shown in FIG. 3.

Figure 5:
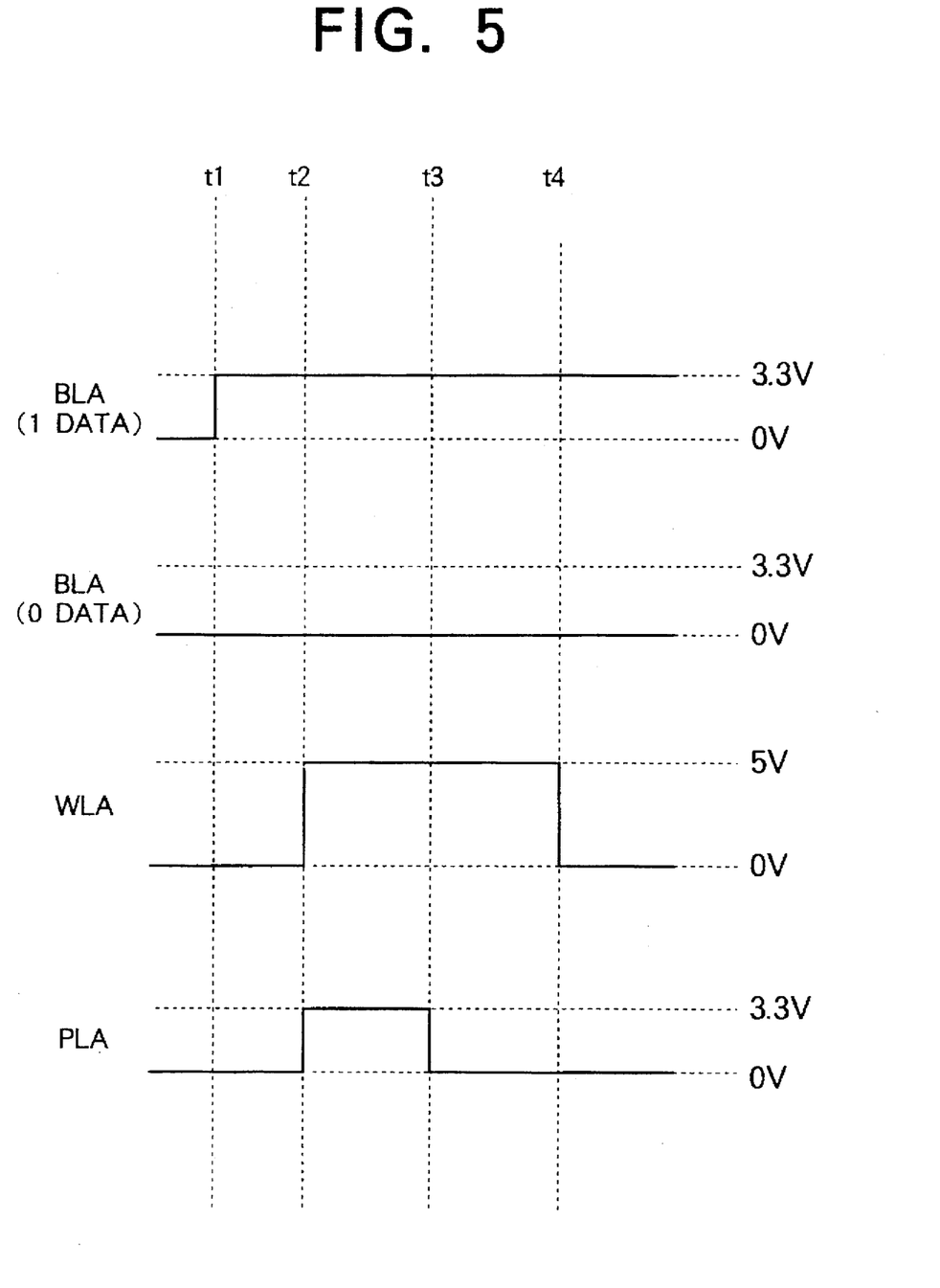
FIG. 5 is a timing chart showing the timing in a write operation to a cell in the first embodiment shown in FIG. 3.

FIG. 5 is a timing chart of the potentials applied to the terminals in the operation for writing on the memory cell MA in the first embodiment shown in FIG. 3.

The write operation of FIG. 5 is performed the same way as the write operation of a conventional ferroelectric memory device having a 1TR-1CAP type cell.

In the write operation, first, the bit line BLA connecting to the memory cell MA is precharged to the ground voltage Vss (0V), then at the time t1, the bit line BLA is set to the power supply voltage Vcc (3.3 V) when the data to be written into the memory cell MA is the data "1", while the bit line BLA is set to the ground voltage Vss (0V) when the data to be written into the memory cell MA is the data "0".

Next, at the time t2, the word line WLA connected to the memory cell MA is raised from 0 V to 5 V, and the plate electrode line PLA is raised from 0 V to 3.3 V.

As a result, when the data to be written into the memory cell MA is the data "0", the ferroelectric capacitor C5 of the memory cell MA shifts in state to a point $\underline{D}$ on the hysteresis characteristic of FIG. 1A until the time t3. This ends the writing of data.

Next, at the time t3, the word line WLA is held at 5 V, and the plate electrode line PL is reduced from 3.3 V to 0 V.

As a result, when the data to be written into the memory cell MA is the data "1", the ferroelectric capacitor C5 of the memory cell MA shifts in state to a point $\underline{C}$ on the hysteresis characteristic of FIG. 1A until the time t4. This ends the writing of data.

Finally, the word line WLA falls from 5 V to 0 V. This ends the write operation.

Figure 6:
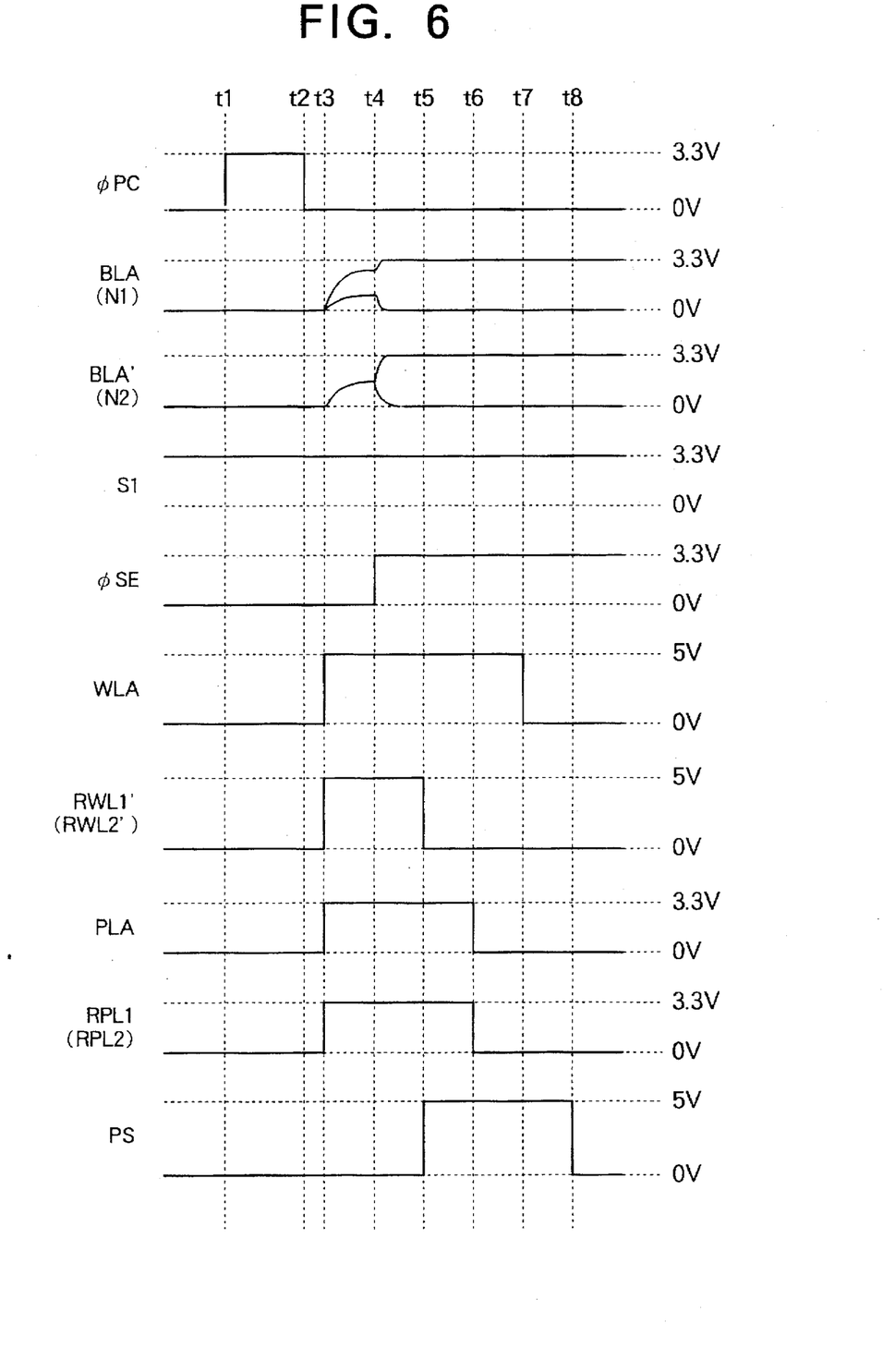
FIG. 6 is a timing chart showing the timing in a read operation on a read cell in the first embodiment shown in FIG. 3.

FIG. 6 is a timing chart of potentials applied to the terminals in the read operation to the memory cell MA in the first embodiment shown in FIG. 3.

In the read operation, first, at the time t1, the precharge signal φPC is raised from 0 V to 3.3 V. Due to this, the bit line BLA connected to the memory cell MA and the bit line BLA' connected to the reference cells RM1' and RM2' are precharged to 0 V.

Also, at the time t2, the precharge signal φPC falls from 3.3 V to 0 V. This ends the initial setting of the bit lines.

Next, at the time t3, the word line WLA connected to the memory cell is raised from 0 V to 5 V, and the plate electrode line PLA is raised from 0 V to 3.3 V.

The word line RWL1' connected to the reference cell RM1' is raised from 0 V to 5 V, and the plate electrode line RPL1 is raised from 0 V to 3.3 V.

The word line RWL2' connected to the reference cell RM2' is raised from 0 V to 5 V, and the plate electrode line RPL2 is raised from 0 V to 3.3 V.

As a result, the potential of the bit line BLA changes corresponding to the read out of the memory cell MA, while the potential of the bit line BLA' changes corresponding to the read out of the reference cell RM1' and the reference cell RM2'.

At this time, when the data of the read memory cell MA is the data "1", the potential of the bit line BLA changes to the higher voltage side since a charge in polarization on the plus side in the hysteresis characteristic of FIG. 1A is read out as shown in FIG. 6. When the data of the read memory cell MA is the data "0", the potential of the bit line BLA changes to the lower voltage side since the charge of polarization on the minus side is read out.

The data "0" is stored in the reference cell RM1', and the data "1" is stored in the reference cell RM2'. Further, the ferroelectric capacitors of the reference cells are designed to become half the size of the ferroelectric capacitors of the memory cells.

Accordingly, when the data "1" is read out to the bit line BLA, as shown in FIG. 6, the potential of the bit line BLA' becomes a middle value of the case of reading out the data "0".

After the potentials of the bit lines change enough, at the time t4, the sense enable signal φSE is raised from 0 V to 3.3 V. Due to this, the sense amplifier SA is activated.

As a result, an operation is performed for comparing and amplifying the data of the memory cell MA and the composite data of the reference cells RM1' and RM2' and the data of the memory cell MA is latched by the sense amplifier SA.

Next, at the time t5, the word line RWL' connected to the reference cell RM1' and the word line RWL2' connected to the reference cell RM2' falls from 5 V to 0 V, and the preset signal PS is raised from 0 V to 5 V.

As a result, the ferroelectric capacitor of the reference cell RM1' shifts in state to the point D on the hysteresis characteristic of FIG. 1A until the plate line RPL1 falls at the time t6. This performs a rewrite operation.

Next, at the time t6, the plate electrode PLA connected to the memory cell MA falls from 3.3 V to 0 V.

As a result, the ferroelectric capacitor of the memory cell MA shifts in state to the point C in the case of the data "1" or the point B in the case of the data "0" on the hysteresis characteristic of FIG. 1A until the word line WLA falls at the time t7. This performs a rewrite operation of the data to the memory cell.

Similarly, at the time t6, the plate electrode line RPL2 connected to the reference cell RM2' falls from 3.3 V to 0 V.

As a result, the ferroelectric capacitor of the reference cell RM2' shifts in state to the point C on the hysteresis characteristic of FIG. 1A until the preset signal PS falls at the time t8. This performs the rewrite operation of the data "1".

Finally, at the time t8, the preset signal PS falls from 5 V to 0 V. This ends the read operation.

As explained above, according to the first embodiment, for example, in a ferroelectric memory having an 1TR-1CAP type cell, since at the time of the read operation the data of the read cell is compared with the composite data of the first and second reference cells storing data having reverse phases with each other and then read out and since the ferroelectric capacitors of the reference cells are designed to be half the size of each of the ferroelectric capacitors of the memory cells, it is possible to realize a ferroelectric memory which can ensure enough of an operational margin and achieve greater reliability.

Figure 7:
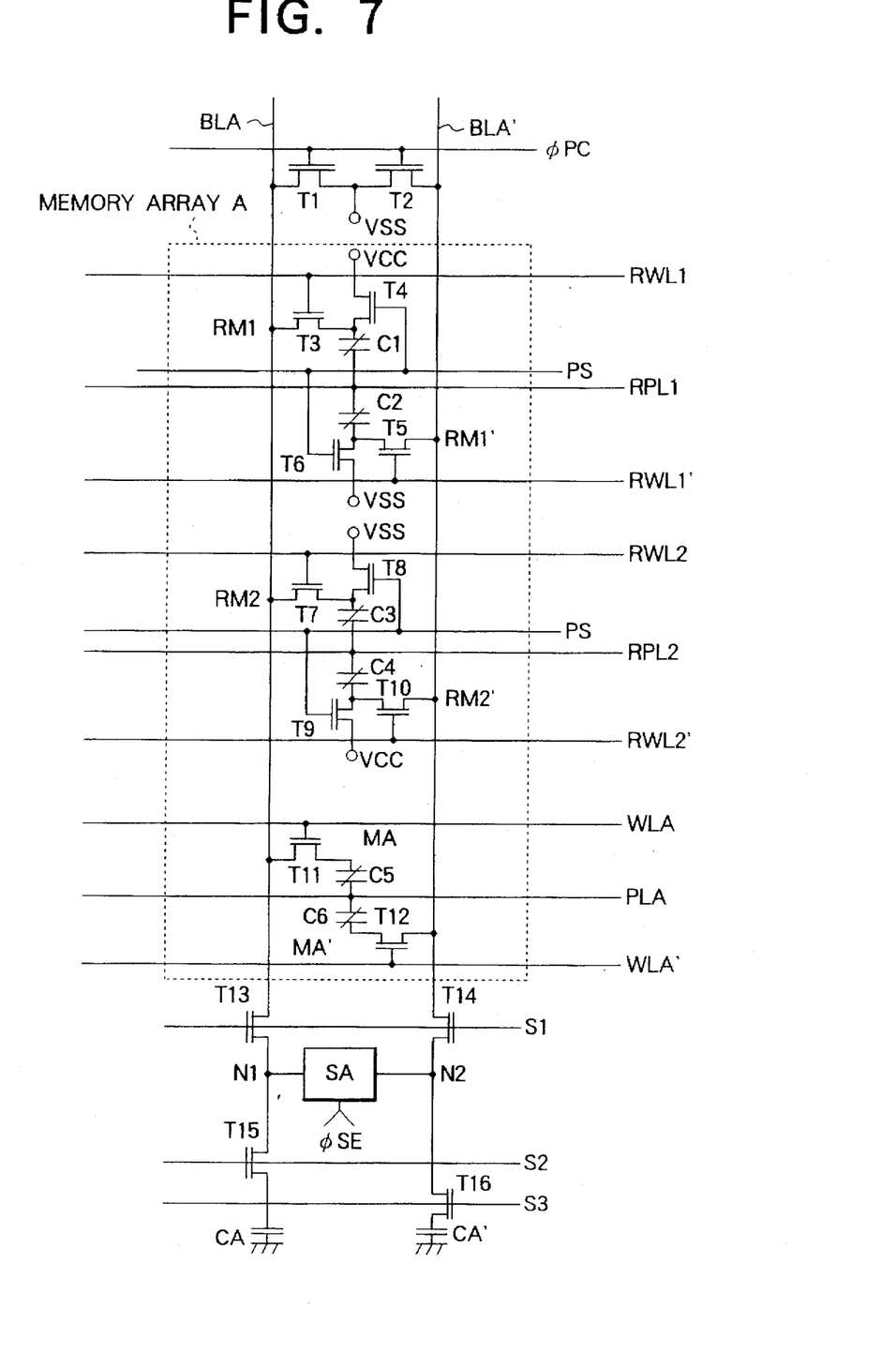
FIG. 7 is a circuit diagram of a second embodiment of a ferroelectric memory according to the present invention.

FIG. 7 is a view of a second embodiment of the ferroelectric memory, more specifically a ferroelectric memory having a 1TR-1CAP type cell.

The second embodiment shown in FIG. 7 has the ferroelectric capacitors of the first reference cell and the second reference cell designed to be the same in size as the ferroelectric capacitor of the memory cells and connects an additional capacitance having the same capacitance as the bit line to the reference bit line. Due to this, the composite data of the first reference cell and the second reference cell becomes a middle value of the read data "1" and "0".

The difference of this second embodiment with the first embodiment is that it is possible to connect an additional capacitance CA to the bit line BLA and connect an additional capacitance CA' to the bit line BLA' at the time of a read operation.

For this, transmission gate transistors T15 and T16 for connecting the additional capacitances CA and CA' to the bit lines BLA and BLA' are arranged as shown in the figure, and select signals S2 and S3 are supplied to gates of the transmission gate transistors T15 and T16.

In the second embodiment, the operations for writing and reading on and from a memory cell are basically the same as the first embodiment shown in FIG. 3.

The only difference of the second embodiment from the first embodiment is that the additional capacitance CA is connected to the bit line BLA and the additional capacitance CA' is connected to the bit line BLA' at the time of reading out data.

Figure 8:
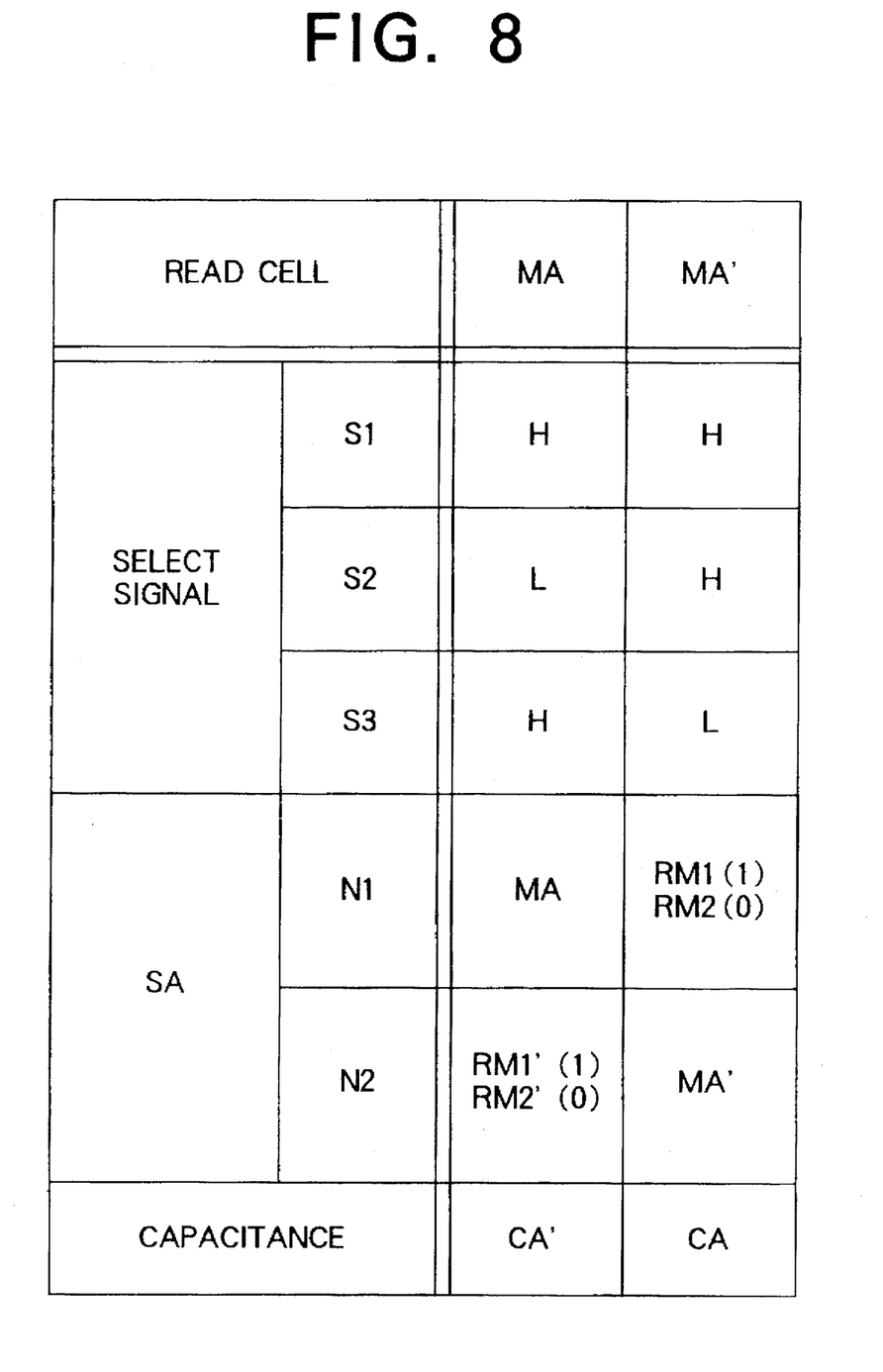
FIG. 8 is a view of a relationship of a connection between input/output nodes of a sense amplifier and a read cell or a reference cell at the time of a read operation in the second embodiment shown in FIG. 7.

FIG. 8 is a view showing which of the read cell or the reference cell is connected to the input/output nodes N1 and N2 of the sense amplifier SA and which of the additional capacitances CA and CA' is selected by control of the select signals S1, S2, and S3 during a read operation of the memory cells MA and MA'.

Namely, when reading out the memory MA, when the select signal S1 is set to a high level (H), the select signal S2 is set to a low level (L), and the select signal S3 is set to the high level, the read cell MA is connected to the node N1, the reference cell RM1' storing the data "0" and the reference cell RM2' storing the data "1" are connected to the node N2, and the additional capacitance CA' is selected.

Also, when reading out the memory cell MA', when the select signal S1 is set to the high level, the select signal S2 is set to the high level, and the select signal S3 is set to the low level, the reference cell RM1 storing the data "1" and the reference cell RM2 storing the data "0" are connected to the node N1, the memory cell MA' is connected to the node N2, and the additional capacitance CA is selected.

As explained above, according to the second embodiment, since, for example, in a ferroelectric memory having a 1TR-1CAP type cell, the data of the read cell is read out compared with the composite data of the first and second reference cells storing data having reverse phases with each other during a read operation, the ferroelectric capacitors of the reference cells are designed to be the same size as the ferroelectric capacitors of the memory cells, and an additional capacitance having a same capacitance as a bit line is connected to the reference bit line, it is possible to realize a ferroelectric memory which can ensure a sufficient operational margin and achieve greater reliability.

Figure 9:
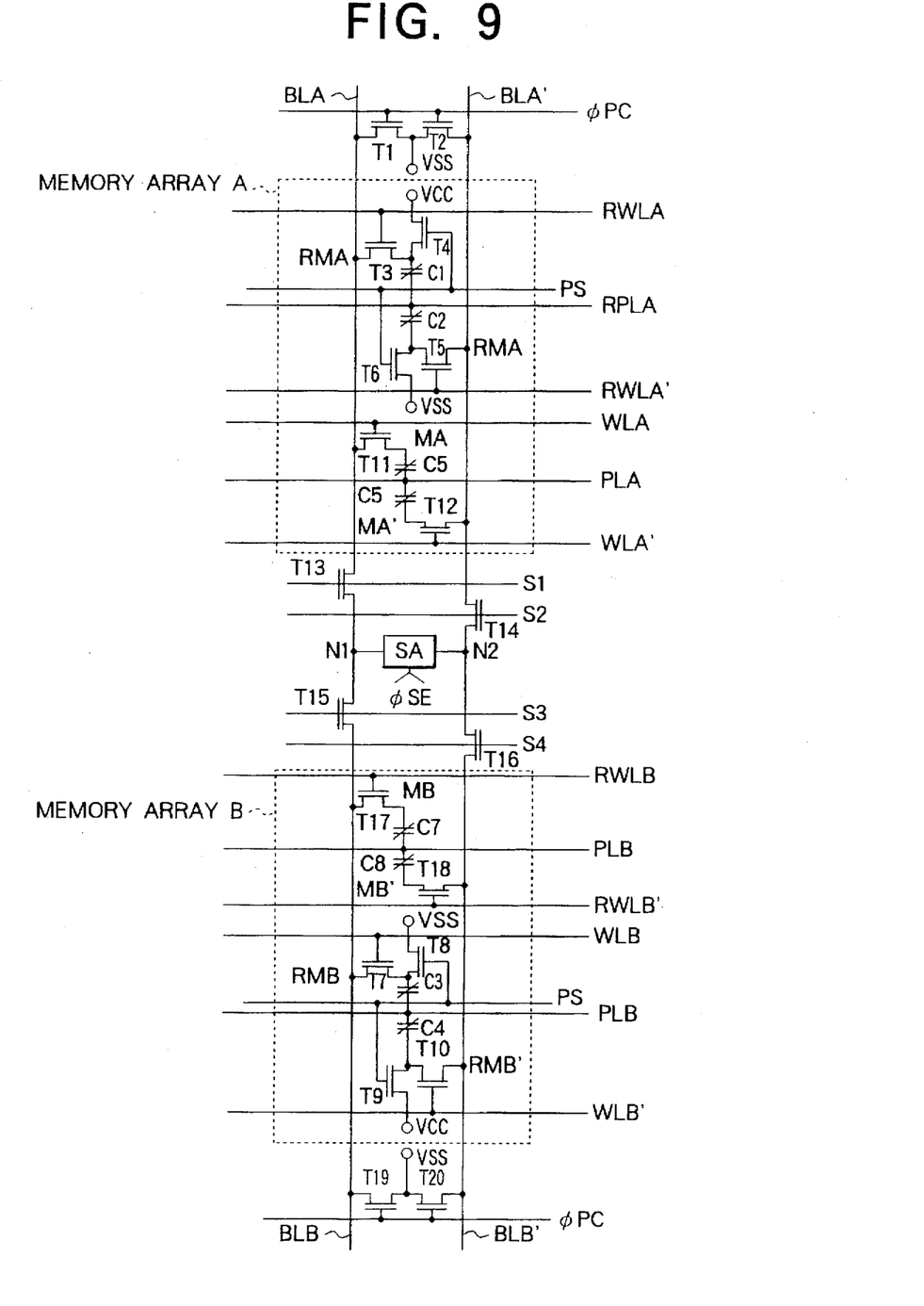
FIG. 9 is a circuit diagram of a third embodiment of a ferroelectric memory according to the present invention.

FIG. 9 is a view of a third embodiment of the ferroelectric memory, more specifically, a ferroelectric memory having a 1TR-1CAP type cell.

The third embodiment shown in FIG. 9 is constituted with the ferroelectric capacitors of the first reference cell and the second reference cell designed to be the same in size as the ferroelectric capacitors of the memory cells similar to the second embodiment, but the additional capacitance connected to the reference bit line is that of a bit line of a non-selected memory array.

As the additional capacitance connected to the reference bit line is that of a bit line of a non-selected memory array, the capacitance of the reference bit line becomes twice the capacitance of the read bit line, and the composite data of the first and second reference cells becomes an ideal middle value between the read data "1" and data "0".

In FIG. 9, a pair of a memory array A and a memory array B having a so-called folded bit line structure are arranged in opposite directions to each other with a sense amplifier SA in the middle.

In the memory array A, a memory cell MA is configured by a select transistor T11 and a ferroelectric capacitor C5, while a memory cell MA' is configured by a select transistor T12 and a ferroelectric capacitor C6.

Also, WLA and WLA' represent word lines, BLA and BLA' represent bit lines, and PLA represents a plate electrode line.

Further, a reference cell RMA is provided corresponding to the bit line BLA, while a reference cell RMA' is provided corresponding to the bit line BLA'.

The reference cell RMA is constituted by a select transistor T3, a ferroelectric capacitor C1, and a preset transistor T4 and connects the ferroelectric capacitor C1 to the supply line of the power source voltage Vcc by a preset signal PS and, due to this, presets to the data "1" (first data).

The reference cell RMA' is constituted by a select transistor T5, a ferroelectric capacitor C2, and a preset transistor T6 and connects the ferroelectric capacitor C2 to the supply line of the power source voltage Vss by the preset signal PS and, due to this, presets to the data "0" (second data).

Also, RWLA, RWLA', RPLA represent word lines and a plate electrode line for driving each of the reference cells.

In the memory array B, a memory cell MB is configured by a select transistor T17 and a ferroelectric capacitor C7, while a memory cell MB' is configured by a select transistor T18 and ferroelectric capacitor C8.

Also, WLB and WLB' represent word lines, BLB and BLB' represent bit lines, and PLB represents a plate electrode line.

Further, a reference cell RMB is provided corresponding to the bit line BLB, while a reference cell RMB' is provided corresponding to the bit line BLB'.

The reference cell RMB is constituted by a select transistor T7, a ferroelectric capacitor C3, and a preset transistor T8 and connects the ferroelectric capacitor C3 to the supply line of power source voltage Vss by a preset signal PS and, due to this, presets to the data "0" (second data).

The reference cell RMB' is constituted by a select transistor T10, a ferroelectric capacitor C4, and a preset transistor T9 and connects the ferroelectric capacitor C4 to the supply line of the power source voltage Vcc and, due to this, presets to the data "1" (first data).

Also, RWLB, RWLB', and RPLB represent word lines and a plate electrode line for driving each of the reference cells.

Transistors T1 and T2 are provided for precharging the bit lines BLA and BLA' to the ground voltage Vss by the precharge signal $\phi$PC.

Transistors T19 and T20 are provided for precharging the bit lines BLB and BLB' to the ground voltage Vss by a precharge signal $\phi$PC.

The sense amplifier SA is activated by a sense enable signal $\phi$SE.

The transmission gate transistors T13, T14, T15, and T16 connect the input/output nodes N1 and N2 of the sense amplifier SA to one of the bit lines BLA, BLA', BLB, and BLB' by the select signals S1, S2, S3, and S4.

In the third embodiment, the operations for writing and reading to and from the memory cells are basically the same as in the first embodiment shown in FIG. 3.

The only difference of the third embodiment with the first embodiment is that the bit line of a non-selected memory array is connected to the bit line of the selected memory array.

Figure 10:
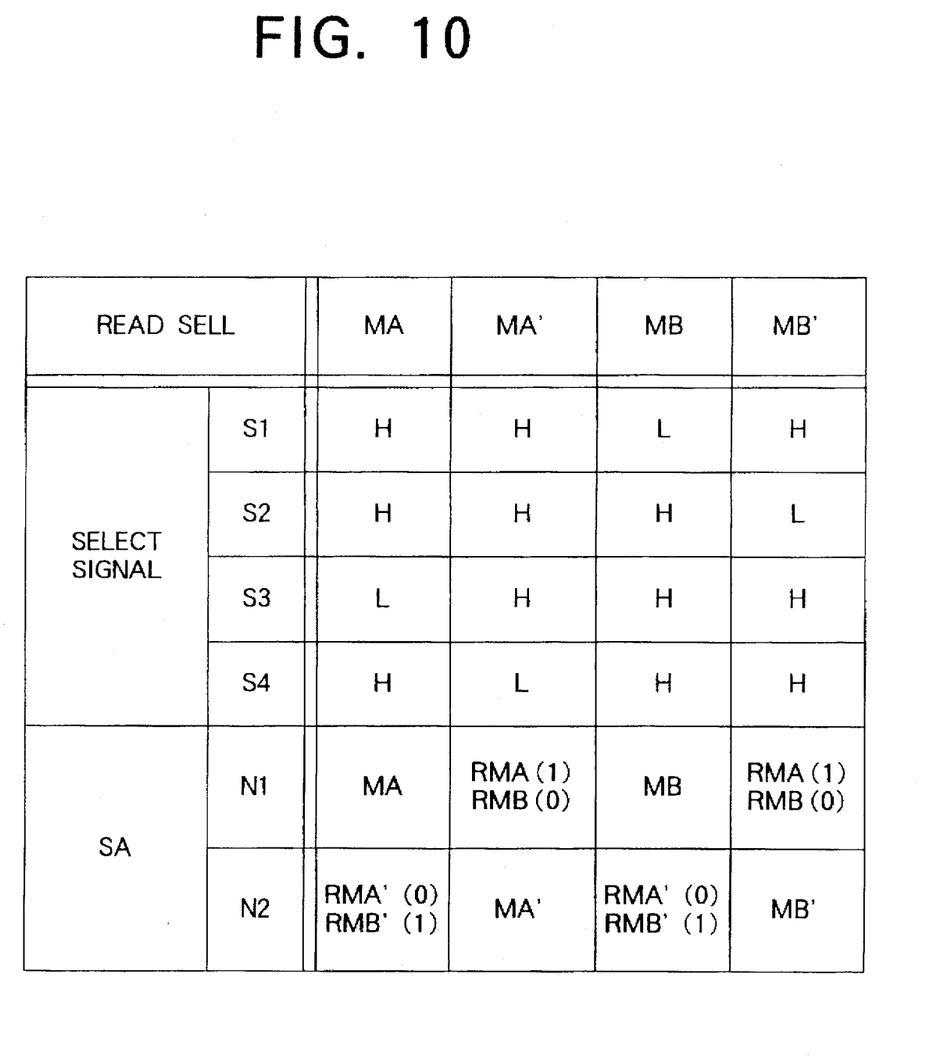
FIG. 10 is a view of a relationship of a connection between input/output nodes of a sense amplifier and a read cell or a reference cell at the time of a read operation in the third embodiment shown in FIG. 9.

FIG. 10 is a view showing which of the read cell or the reference cell is connected to the input/output nodes N1 and N2 of the sense amplifier SA by control of the select signal S1, S2, S3, and S4 when reading the memory cells MA, MA', MB, and MB'.

Namely, when reading out the memory cell MA, when the select signal S1 is set to a high level, the select signal S2 is set to a high level, the select signal S3 is set to the low level, and the select signal S4 is set to the high level, the read cell MA is connected to the node N1 and the reference cell RMA' storing the data "0" and the reference cell RMB' storing the data "1" are connected to the node N2.

Also, when reading out the memory cell MA', when the select signal S1 is set to the high level, the select signal S2 is set to the high level, the select signal S3 is set to the high level, and the select signal S4 is set to the low level, the reference cell RMA storing the data "1" and the reference cell RMB storing the data "0" are connected to the node N1 and the memory cell MA' is connected to the node N2.

Also, when reading out the memory cell MB, when the select signal S1 is set to the low level, the select signal S2 is set to the high level, the select signal S3 is set to the low level, and the select signal S4 is set to the high level, the read cell MB is connected to the N1 and the reference cell RMA' storing the data "0" and the reference cell RMB' storing the data "1" are connected to the node N2.

Also, when reading out the memory cell MB', when the select signal S1 is set to the high level, the select signal S2 is set to the low level, the select signal S3 is set to the high level, and the select signal S4 is set to the high level, the reference cell RHA storing the data "1" and the reference cell RMB storing the data "0" are connected to the node N1 and the read cell is connected to the node N2.

As explained above, according to the third embodiment, for example in a ferroelectric memory having a 1TR-1CAP type cell, at the time of a read operation, the data of the read cell is read out compared with the composite data of the first and second reference cells storing data having reverse phases with each other, the ferroelectric capacitors of the reference cells are designed to be the same size as the ferroelectric capacitors of the memory cells, and a bit line of a non-selected memory array is connected as an additional capacitance to the reference cells, so it is possible to realize a ferroelectric memory which can ensure a sufficient operational margin and improve the reliability.

Many widely different embodiments of the present invention may be constructed without departing from the spirit and scope the present invention. It should be understood that the present invention is not restricted to the specific embodiments described above.

What is claimed is:

1. A ferroelectric memory, comprising:

at least one word line, a bit line, a reference word line, a reference bit line, at least one memory cell comprising a first transmission transistor with a first terminal connected to the bit line and a gate connected to the word line, and a ferroelectric capacitor for storing data connected between a second terminal of the first transmission transistor and a plate electrode, a first reference cell comprising a second transmission transistor with a first terminal connected to the reference bit line and a gate connected to the reference word line, and a first reference data storing ferroelectric capacitor for storing first reference data, said first reference data storing ferroelectric capacitor being connected between a second terminal of the second transmission transistor and a first reference plate electrode, and a second reference cell comprising a third transmission transistor with a first terminal connected to the reference bit line and a gate connected to the reference word line, and a second reference data storing ferroelectric capacitor for storing second reference data having a reverse phase from the first reference data, said second reference data storing ferroelectric capacitor being connected between a second terminal of the third transmission transistor and a second reference plate electrode;

wherein said first and second reference data storing capacitors have an area which is one half an area of said ferroelectric capacitor of said at least one memory cell.

2. A ferroelectric memory according to claim 1, further comprising a sense amplifier connected to said bit line and said reference bit line for comparing a potential of the read bit line and a potential of the reference bit line during a read operation, and determining content of said at least one memory cell in response to said comparison.

3. A ferroelectric memory, comprising:

at least one word line, a bit line, a reference word line, a reference bit line, at least one memory cell comprising a first transmission transistor with a first terminal connected to the bit line and a gate connected to the word line, and a ferroelectric capacitor for storing data connected between a second terminal of the first transmission transistor and a plate electrode, a first reference cell comprising a second transmission transistor with a first terminal connected to the reference bit line and a gate connected to the reference word line, and a first reference data storing ferroelectric capacitor for storing first reference data, said first reference data storing ferroelectric capacitor being connected between a second terminal of the second transmission transistor and a first reference plate electrode, a second reference cell comprising a third transmission transistor with a first terminal connected to the reference bit line and a gate connected to the reference word line, and a second reference data storing ferroelectric capacitor for storing second reference data having a reverse phase from the first reference data, said second reference data storing ferroelectric capacitor being connected between a second terminal of the third transmission transistor and a second reference plate electrode, and a switch for connecting an additional capacitance to the reference bit line at the time of a read operation.

4. A ferroelectric memory according to claim 3, wherein the ferroelectric capacitor of the at least one memory cell is equal in size to the ferroelectric capacitors of the first and second reference cells.

5. A ferroelectric memory according to claim 3, wherein:

the ferroelectric memory comprises a plurality of memory arrays each comprising a word line, a bit line, a reference word line, a reference bit line, a memory cell and first and second reference cells; and said additional capacitance is a capacitance of a bit line of a non-selected memory array.

6. A ferroelectric memory according to claim 3, further comprising a second switch for connecting a second additional capacitance to said bit line at a time of a read operation.

7. A ferroelectric memory according to claim 3, further comprising a sense amplifier connected to said bit line and said reference bit line for comparing a potential of the read bit line and a potential of the reference bit line during a read operation, and determining content of said at least one memory cell in response to said comparison.

8. A ferroelectric memory according to claim 3, wherein said additional capacitance is equal to a capacitance of said bit line.

9. A ferroelectric memory according to claim 5, wherein said additional capacitance causes a total capacitance of said reference bit line to be twice a capacitance of said bit line.

10. A ferroelectric memory according to claim 3, wherein said switch is a transistor.

11. A ferroelectric memory according to claim 3, wherein said additional capacitance is a capacitor connected between said switch and ground.

12. A ferroelectric memory, comprising;

at least one word line;

a bit line;

a reference word line;

a reference bit line;

at least one memory cell comprising a first transmission transistor with a first terminal connected to the bit line and a gate connected to the word line, and a ferroelectric capacitor for storing data connected between a second terminal of the first transmission transistor and a plate electrode;

a first reference cell comprising a second transmission transistor with a first terminal connected to the reference bit line and a gate connected to the reference word line, a first reference data storing ferroelectric capacitor for storing first reference data connected between a second terminal of the second transmission transistor and a first reference plate electrode, and a first connecting means for connecting a first connection point of the second transmission transistor and the first reference data storing ferroelectric capacitor to a predetermined first potential;

a second reference cell comprising a third transmission transistor with a first terminal connected to the reference bit line and a gate connected to the reference word line, a second reference data storing ferroelectric capacitor for storing second reference data having a reverse phase from the first reference data connected between the first terminal of the third transmission transistor and a second reference plate electrode, and a second connecting means for connected a second connection point of the third transmission transistor and the second reference data storing ferroelectric capacitor to a predetermined second potential; and means for writing the first reference data into the first reference cell by connecting the first connection point to the first potential and writing the second reference data into the second reference cell by connecting the second connection point to the second potential.

13. A ferroelectric memory according to claim 12, further comprising a sense amplifier connected to said bit line and said reference bit line for comparing a potential of the read bit line and a potential of the reference bit line during a read operation, and determining content of said at least one memory cell in response to said comparison.

* * * * *